(12) United States Patent
Lower et al.

(10) Patent No.: US 8,076,185 B1
(45) Date of Patent: Dec. 13, 2011

(54) INTEGRATED CIRCUIT PROTECTION AND RUGGEDIZATION COATINGS AND METHODS

(75) Inventors: Nathan P. Lower, North Liberty, IA (US); Ross K. Wilcoxon, Cedar Rapids, IA (US); Alan P. Boone, Swisher, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 103 days.

(21) Appl. No.: 11/508,782

(22) Filed: Aug. 23, 2006

(51) Int. Cl.
*H01L 21/00* (2006.01)
(52) U.S. Cl. .................. 438/127; 257/E21.502; 438/106
(58) Field of Classification Search .................... 438/127
See application file for complete search history.

(56) References Cited

U.S. PATENT DOCUMENTS

| | | | |
|---|---|---|---|
| 3,508,974 A | 4/1970 | Bressler | |
| 3,654,528 A | 4/1972 | Barkan | |
| 3,723,790 A | 3/1973 | Dumbaugh et al. | |
| 3,812,404 A | 5/1974 | Barkan et al. | |
| 4,177,015 A | 12/1979 | Davidson | |
| 4,294,658 A | 10/1981 | Humphreys et al. | |
| 4,410,874 A | 10/1983 | Scapple et al. | |
| 4,505,644 A | 3/1985 | Meisner et al. | |
| 4,513,029 A | 4/1985 | Sakai | |
| 4,560,084 A | 12/1985 | Wolfson | |
| 4,572,924 A | 2/1986 | Wakely et al. | |
| 4,622,433 A | 11/1986 | Frampton | |
| 4,761,518 A | 8/1988 | Butt et al. | |
| 4,765,948 A | 8/1988 | Deluca et al. | |
| 4,773,826 A | 9/1988 | Mole | |
| 4,802,531 A | 2/1989 | Nathenson et al. | |
| 4,882,212 A | 11/1989 | SinghDeo et al. | |
| 5,041,342 A | 8/1991 | Umeda et al. | |
| 5,136,365 A | 8/1992 | Pennisi et al. | |
| 5,140,109 A | 8/1992 | Matsumoto et al. | |
| 5,184,211 A | 2/1993 | Fox | |
| 5,195,231 A | 3/1993 | Fanning et al. | |
| 5,232,970 A | 8/1993 | Sole et al. | |
| 5,244,726 A | 9/1993 | Laney et al. | |
| 5,265,136 A | 11/1993 | Yamazaki et al. | |
| 5,315,155 A | 5/1994 | O'Donnelly et al. | |
| 5,502,889 A | 4/1996 | Casson et al. | |
| 5,581,286 A | 12/1996 | Hayes et al. | |
| 5,686,703 A | 11/1997 | Yamaguchi | |
| 5,702,963 A | 12/1997 | Vu et al. | |
| 5,863,605 A | 1/1999 | Bak-Boychuk et al. | |
| 5,916,944 A * | 6/1999 | Camilletti et al. | 524/394 |

(Continued)

FOREIGN PATENT DOCUMENTS

JP 57027942 2/1982

(Continued)

OTHER PUBLICATIONS

Non-Final Office Action for U.S. Appl. No. 11/784,158, dated Apr. 21, 2009, 10 pages.

(Continued)

*Primary Examiner* — Charles Garber
*Assistant Examiner* — Pape Sene
(74) *Attorney, Agent, or Firm* — Daniel M. Barbieri

(57) ABSTRACT

An electronics package includes a substrate and at least one electronic component coupled to the substrate. The electronics package comprises an alkali silicate coating forming a hermetic seal around at least a portion of the at least one electronic component.

34 Claims, 8 Drawing Sheets

U.S. PATENT DOCUMENTS

| | | | |
|---|---|---|---|
| 5,958,794 | A | 9/1999 | Bruxvoort et al. |
| 5,965,947 | A | 10/1999 | Nam et al. |
| 5,991,351 | A | 11/1999 | Woolley |
| 6,010,956 | A | 1/2000 | Takiguchi et al. |
| 6,019,165 | A | 2/2000 | Batchelder |
| 6,021,844 | A | 2/2000 | Batchelder |
| 6,027,791 | A | 2/2000 | Higashi et al. |
| 6,028,619 | A | 2/2000 | Saita et al. |
| 6,039,896 | A | 3/2000 | Miyamoto et al. |
| 6,048,656 | A | 4/2000 | Akram et al. |
| 6,087,018 | A * | 7/2000 | Uchiyama ............... 428/469 |
| 6,110,656 | A | 8/2000 | Eichorst et al. |
| 6,121,175 | A * | 9/2000 | Drescher et al. ............ 501/59 |
| 6,124,224 | A | 9/2000 | Sridharan et al. |
| 6,159,910 | A | 12/2000 | Shimizu et al. |
| 6,356,334 | B1 | 3/2002 | Mathew et al. |
| 6,423,415 | B1 * | 7/2002 | Greene et al. ............ 428/432 |
| 6,451,283 | B1 * | 9/2002 | Kuznicki et al. ........... 423/716 |
| 6,452,090 | B2 | 9/2002 | Takato et al. |
| 6,486,087 | B1 | 11/2002 | Saling et al. |
| 6,586,087 | B2 | 7/2003 | Young |
| 6,599,643 | B2 * | 7/2003 | Heimann et al. ............ 428/623 |
| 6,658,861 | B1 | 12/2003 | Ghoshal et al. |
| 6,665,186 | B1 | 12/2003 | Calmidi et al. |
| 6,708,501 | B1 | 3/2004 | Ghoshal et al. |
| 6,798,072 | B2 | 9/2004 | Kajiwara et al. |
| 6,800,326 | B1 | 10/2004 | Uchiyama |
| 6,918,984 | B2 | 7/2005 | Murray et al. |
| 7,045,905 | B2 * | 5/2006 | Nakashima ............... 257/787 |
| 7,078,263 | B2 | 7/2006 | Dean |
| 7,131,286 | B2 | 11/2006 | Ghoshal et al. |
| 7,176,564 | B2 | 2/2007 | Kim |
| 7,202,598 | B2 | 4/2007 | Juestel et al. |
| 7,293,416 | B2 | 11/2007 | Ghoshal |
| 7,296,417 | B2 | 11/2007 | Ghoshal |
| 7,297,206 | B2 | 11/2007 | Naruse et al. |
| 7,340,904 | B2 | 3/2008 | Sauciuc et al. |
| 7,342,787 | B1 | 3/2008 | Bhatia |
| 7,348,665 | B2 | 3/2008 | Sauciuc et al. |
| 7,391,060 | B2 | 6/2008 | Oshio |
| 7,491,431 | B2 | 2/2009 | Chiruvolu et al. |
| 7,692,259 | B2 | 4/2010 | Suehiro |
| 7,737,356 | B2 | 6/2010 | Goldstein |
| 7,915,527 | B1 | 3/2011 | Lower et al. |
| 2001/0015443 | A1 | 8/2001 | Komoto |
| 2001/0046933 | A1 | 11/2001 | Parkhill et al. |
| 2002/0000630 | A1 | 1/2002 | Coyle |
| 2002/0054976 | A1 | 5/2002 | Nakamura et al. |
| 2002/0078856 | A1 * | 6/2002 | Hahn et al. ............... 106/14.14 |
| 2002/0086115 | A1 * | 7/2002 | Lamers et al. ............ 427/385.5 |
| 2002/0170173 | A1 * | 11/2002 | Mashino ............... 29/852 |
| 2002/0189495 | A1 | 12/2002 | Hayashi et al. |
| 2002/0189894 | A1 | 12/2002 | Davis et al. |
| 2003/0047735 | A1 * | 3/2003 | Kyoda et al. ............ 257/66 |
| 2003/0080341 | A1 | 5/2003 | Sakano et al. |
| 2003/0218258 | A1 | 11/2003 | Charles et al. |
| 2003/0228424 | A1 | 12/2003 | Dove et al. |
| 2004/0106037 | A1 * | 6/2004 | Cho et al. ............ 429/144 |
| 2004/0116577 | A1 | 6/2004 | Naruse et al. |
| 2004/0156995 | A1 | 8/2004 | Komiyama et al. |
| 2004/0194667 | A1 | 10/2004 | Reuscher |
| 2005/0003947 | A1 * | 1/2005 | Mazany et al. ............ 501/32 |
| 2005/0082691 | A1 * | 4/2005 | Ito et al. ............ 257/788 |
| 2005/0099775 | A1 | 5/2005 | Pokharna et al. |
| 2005/0123684 | A1 * | 6/2005 | Makowski et al. ............ 427/384 |
| 2005/0179742 | A1 * | 8/2005 | Keenan et al. ............ 347/65 |
| 2006/0045755 | A1 | 3/2006 | McDonald et al. |
| 2006/0068218 | A1 | 3/2006 | Hooghan et al. |
| 2006/0095677 | A1 | 5/2006 | Hakura et al. |
| 2006/0135342 | A1 | 6/2006 | Anderson et al. |
| 2006/0158849 | A1 | 7/2006 | Martin et al. |
| 2006/0250731 | A1 | 11/2006 | Parkhurst et al. |
| 2006/0268525 | A1 | 11/2006 | Jeong |
| 2006/0283546 | A1 * | 12/2006 | Tremel et al. ............ 156/291 |
| 2007/0075323 | A1 | 4/2007 | Kanazawa et al. |
| 2007/0102833 | A1 * | 5/2007 | Hack et al. ............ 257/789 |
| 2007/0108586 | A1 | 5/2007 | Uematsu et al. |
| 2007/0224400 | A1 | 9/2007 | Meguro et al. |
| 2008/0006204 | A1 | 1/2008 | Rusinko et al. |
| 2008/0050512 | A1 | 2/2008 | Lower et al. |
| 2008/0063875 | A1 | 3/2008 | Robinson et al. |
| 2008/0142966 | A1 | 6/2008 | Hirano et al. |
| 2008/0299300 | A1 | 12/2008 | Wilcoxon et al. |

FOREIGN PATENT DOCUMENTS

| | | |
|---|---|---|
| JP | 60-013875 | 1/1985 |
| JP | 02-064071 | 3/1990 |
| JP | 2003-332505 A | 11/2003 |
| JP | 2006-045420 | 2/2006 |
| WO | WO 2006/095677 | 9/2006 |
| WO | WO 2006/095677 A1 | 9/2006 |
| WO | PCT/US2008/074224 | 8/2008 |
| WO | PCT/US2008/075591 | 9/2008 |
| WO | PCT/US2009/031699 | 1/2009 |

OTHER PUBLICATIONS

Non-Final Office Action for U.S. Appl. No. 11/784,932, dated Apr. 3, 2009, 8 pages.

International Search Report and Written Opinion for Application No. PCT/US2008/075591, mailing date Apr. 8, 2009, 7 pages.

John C. Thresh, "the Action of Natural Waters on Lead," The Analyst, vol. XLVII, No. 560, (Nov. 1922) pp. 459-468.

Click, et al, "SCHOTT Low Temperature Bonding for Precision Optics," can be found at website: http://optics.nasa.gov/tech_days/tech_days_2004/docs/18%20Aug%202004/23%20Schott%20Low%20Temperature%20Bonding.pdf, p. 20.

PQ Corporation, "Bonding and Coating Applications of PQ® Soluble Silicates," Bulletin 12-31, (2003), p. 7.

PQ Corporation, "PQ® Soluble Silicates in Refractory and Chemical-Resistant Cements," Bulletin 24-1, (2003), p. 6.

International Search Report and Written Opinion for Application No. PCT/US2009/036355, mail date Jun. 30, 2009, 11 pages.

International Search Report and Written Opinion for Application No. PCT/US2009/031699, mail date Aug. 18, 2009, 16 pages.

Office Action for U.S. Appl. No. 11/959,225 (F&L Ref. 047141-0536), mail date Dec. 2, 2009, 15 pages.

Office Action for U.S. Appl. No. 12/116,126 (F&L Ref.: 047141-0556), mail date Nov. 20, 2009, 7 pages.

Office Action for U.S. Appl. No. 11/784,932 (F&L Ref.: 047141-0628), mail date Feb. 16, 2010, 11 pages.

Office Action for U.S. Appl. No. 11/784,158 (F&L Ref.: 047141-0629), mail date Oct. 8, 2009, 7 pages.

Office Action for U.S. Appl. No. 11/784,158 (F&L Ref.: 047141-0629), mail date Mar. 26, 2010, 7 pages.

Office Action for U.S. Appl. No. 12/116,126 (F&L Ref.: 047141-0556), mail date Apr. 22, 2010, 7 pages.

Office Action for U.S. Appl. No. 11/959,225 (F&L Ref.: 047141-0536), mail date May 26, 2010, 17 pages.

Office Action for U.S. Appl. No. 11/784,158 (F&L Ref.: 047141-0629), mail date Jun. 17, 2010, 7 pages.

International Search Report and Written Opinion for International Application No. PCT/US2008/074224, mail date Jan. 30, 2009, 9 pages.

International Search Report and Written Opinion for International Application No. PCT/US2008/075591, mail date Apr. 8, 2009, 7 pages.

Office Action for U.S. Appl. No. 12/284,670 (F&L Ref.: 047141-0614), mail date Sep. 28, 2010, 11 pages.

Office Action for U.S. Appl. No. 12/116,126 (F&L Ref.: 047141-0556), mail date Oct. 25, 2010, 9 pages.

Office Action for U.S. Appl. No. 12/286,207 (F&L Ref.: 047141-0609), mail date Dec. 27, 2010, 15 pages.

Office Action for U.S. Appl. No. 11/732,982 (F&L Ref.: 047141-0626), mail date Feb. 2, 2011, 16 pages.

Office Action for U.S. Appl. No. 12/284,670 (F&L Ref.: 047141-0614), mail date Feb. 17, 2011, 13 pages.

Office Action for U.S. Appl. No. 12/116,126 (F&L Ref.: 047141-0556), mail date Feb. 25, 2011, 9 pages.

Office Action for U.S. Appl. No. 11/732,981 (F&L Ref.: 047141-0627), mail date Mar. 16, 2011, 7 pages.

Golubev, K.S., et al., Modeling of Acid-Base Properties of Binary Alkali-Silicate Melts, Rev. Adv. Mater. Sci. 6, (2004), pp. 33-40, website: http://www.ipme.ru/e-journals/RAMS/no_1604/golubev/golubev.pdf.

Kennedy, C. R., Strength and Fracture Toughness of Binary Alkali Silicate Glasses (Abstract only), Feb. 14, 1974, website: http://oai.dtic.mil/oai/oai?verb=getRecord&metadataPrefix=html&identifier=ADA016820, 1 page.

Nascimento, M. L. F., et al. Universal curve of ionic conductivities in binary alkali silicate glasses, Journal of Materials Science (2005), Springer Science + Business Media, Inc., website: http://www.springerlink.com/content/p7535075x1872016/, 3 pgs.

Pedone, A., et al. Insight into Elastic Properties of Binary Alkali Silicate Glasses; Prediction and Interpretation through Atomistic Simulation Techniques, Chemistry of Materials, 2007, vol. 19, No. 13, pp. 3144-3154, American Chemical Society (Abstract only) website: http//pubs.acs.org/doi/abs/10.1021/cm062619r, 2 pgs.

Shermer, H. F., Thermal expansion of binary alkali silicate glasses, Journal of Research of the National Bureau of Standards, vol. 57, No. 2, Aug. 1956, Research Paper No. 2698, website: http://nvl.nist.gov/pub/nistpubs/jres/057/2/V57.N02.A05.pdf, 5 pgs.

The Mixed—Alkali Effect for the Viscosity of Glasses, printed on Dec. 3, 2010 from website: http://glassproperties.com/viscosity/mixed-alkali-effect-viscosity/, 7 pages.

The Structure of Glasses. Alkali silicate glasses, printed on Dec. 3, 2010 from website: http://www.ptc.tugraz.at/specmag/struct/ss.htm, 1 page.

US Office Action for U.S. Appl. No. 11/732,981 (F&L Ref.: 047141-0627), mail date Oct. 6, 2010, 10 pages.

US Office Action for U.S. Appl. No. 11/959,225 (F&L Ref.: 047141-0536), mail date Oct. 27, 2010, 12 pages.

US Office Action for U.S. Appl. No. 11/784,932 (F&L Ref.: 047141-0628), mail date Nov. 10, 2010, 10 pages.

Notice of Allowance for U.S. Appl. No. 11/784,158 (F&L Ref.: 047141-0629), mail date Nov. 29, 2010, 8 pages.

U.S. Appl. No. 12/286,207, filed Sep. 29, 2008, Lower et al.
U.S. Appl. No. 12/240,775, filed Sep. 29, 2008, Lower et al.
U.S. Appl. No. 12/116,126, filed May 6, 2008, Lower et al.
U.S. Appl. No. 11/959,225, filed Dec. 18, 2007, Lower et al.
U.S. Appl. No. 11/784,932, filed Apr. 10, 2007, Lower et al.
U.S. Appl. No. 11/732,981, filed Apr. 5, 2007, Wilcoxon et al.
U.S. Appl. No. 11/732,982, filed Apr. 5, 2007, Boone et al.
U.S. Appl. No. 11/784,158, filed Apr. 5, 2007, Lower et al.

Lewis, J. A., et al., Materialstoday: Jul./Aug. 2004, Direct Writing in three dimension, ISSN: 1369 7021© Elsevier Ltd 2004, pp. 32-39.

Response for U.S. Appl. No. 11/784,158, mail date Jan. 8, 2010, 10 pages.

Amendment and Reply for U.S. Appl. No. 11/784,158, mail date May 26, 2010, 12 pages.

Notice of Allowance for U.S. Appl. No. 11/732,981, mail date Jul. 26, 2011, 7 pages.

Response for U.S. Appl. No. 11/784,932, mail date Jul. 2, 2009, 8 pages.

Notice of Allowance for U.S. Appl. No. 11/784,932, mail date May 12, 2011, 11 pages.

Request for Continued Examination (RCE) for U.S. Appl. No. 11/784,932, Aug. 10, 2011, 4 pages.

Notice of Allowance for U.S. Appl. No. 11/784,932, mail date Aug. 23, 2011, 8 pages.

Notice of Allowance for U.S. Appl. No. 12/284,670, mail date May 11, 2011, 7 pages.

Notice of Allowance for U.S. Appl. No. 12/286,207, mail date Jun. 27, 2011, 12 pages.

Office Action for U.S. Appl. No. 11/732,982, mail date Jun. 21, 2011, 14 pages.

Office Action for U.S. Appl. No. 11/959,225, mail date Jul. 22, 2009, 10 pages.

Response for U.S. Appl. No. 11/959,225, mail date Mar. 2, 2010, 9 pages.

Office Action for U.S. Appl. No. 11/959,225, mail date Apr. 13, 2011, 16 pages.

Response for U.S. Appl. No. 12/116,126, mail date Feb. 22, 2010, 10 pages.

Office Action for U.S. Appl. No. 12/116,126, mail date May 10, 2011, 8 pages.

Office Action for U.S. Appl. No. 12/240,775, mail date May 26, 2011, 9 pages.

* cited by examiner

REACTION OF SILICA ONTO METAL, GLASS, OR CERAMIC SURFACE.

INTEGRATED CIRCUIT PROTECTION AND RUGGEDIZATION COATINGS AND METHODS

BACKGROUND

The invention generally relates to coatings for integrated circuits or other electronics packages. The invention also relates generally to methods of providing such coatings.

Conventionally integrated circuits are designed for use in relatively benign environments such as desktop PC's, cell phones, and the like. When these integrated circuit technologies are used in more demanding environments such as avionics they may experience excessively high failure rates due to the higher operating temperature, corrosion, etc. In addition, due to the sensitive nature of the information that may be stored on these components, it may be necessary to protect these devices from reverse engineering in the event that a system containing them were to fall into unfriendly hands. Modifying integrated circuits to improve their thermal performance, corrosion resistance, and tamper resistance is typically very expensive and can be detrimental to reliability.

Therefore, what is needed is a low-cost, simple method for making commercial integrated circuits more suitable for use in harsh environments. Further, what is needed is a low-cost coating for an integrated circuit which provides resistance to damage in harsh environments.

The techniques herein below extend to those embodiments which fall within the scope of the appended claims, regardless of whether they accomplish one or more of the above-mentioned needs.

SUMMARY

What is provided is an electronics package. The electronics package comprises a substrate and at least one electronic component coupled to the substrate. The electronics package also comprises an alkali silicate coating forming a hermetic seal around at least a portion of the at least one electronic component.

What is also provided is a method of forming an electronics package. The method comprises providing at least one electronic component. The method further comprises mixing an alkali silicate material with water, micro, and or nano particles and depositing the coating onto the electronic component. Further still, the method comprises curing the alkali silicate material.

What is also provided is an electronics package. The electronics package comprises a substrate and at least one electronic component coupled to the substrate. The electronics package also comprises a low curing temperature glass coating forming a hermetic seal around at least a portion of the at least one electronic component.

Further, what is provided is a method of forming an electronics package. The method comprises providing at least one electronic component and mixing a low curing temperature glass solution with water, micro and or nano particles. The method further comprises depositing the coating onto the electronic component and curing the glass material.

Alternative exemplary embodiments relate to other features and combination of features as may be generally recited in the claims.

BRIEF DESCRIPTION OF THE DRAWINGS

A better understanding of the features and advantages of the present invention will be obtained by reference to the following detailed description that sets forth illustrative embodiments by way of example only, in which the principles of the invention are utilized, and the accompanying drawings, of which.

DETAILED DESCRIPTION

Figure 1:
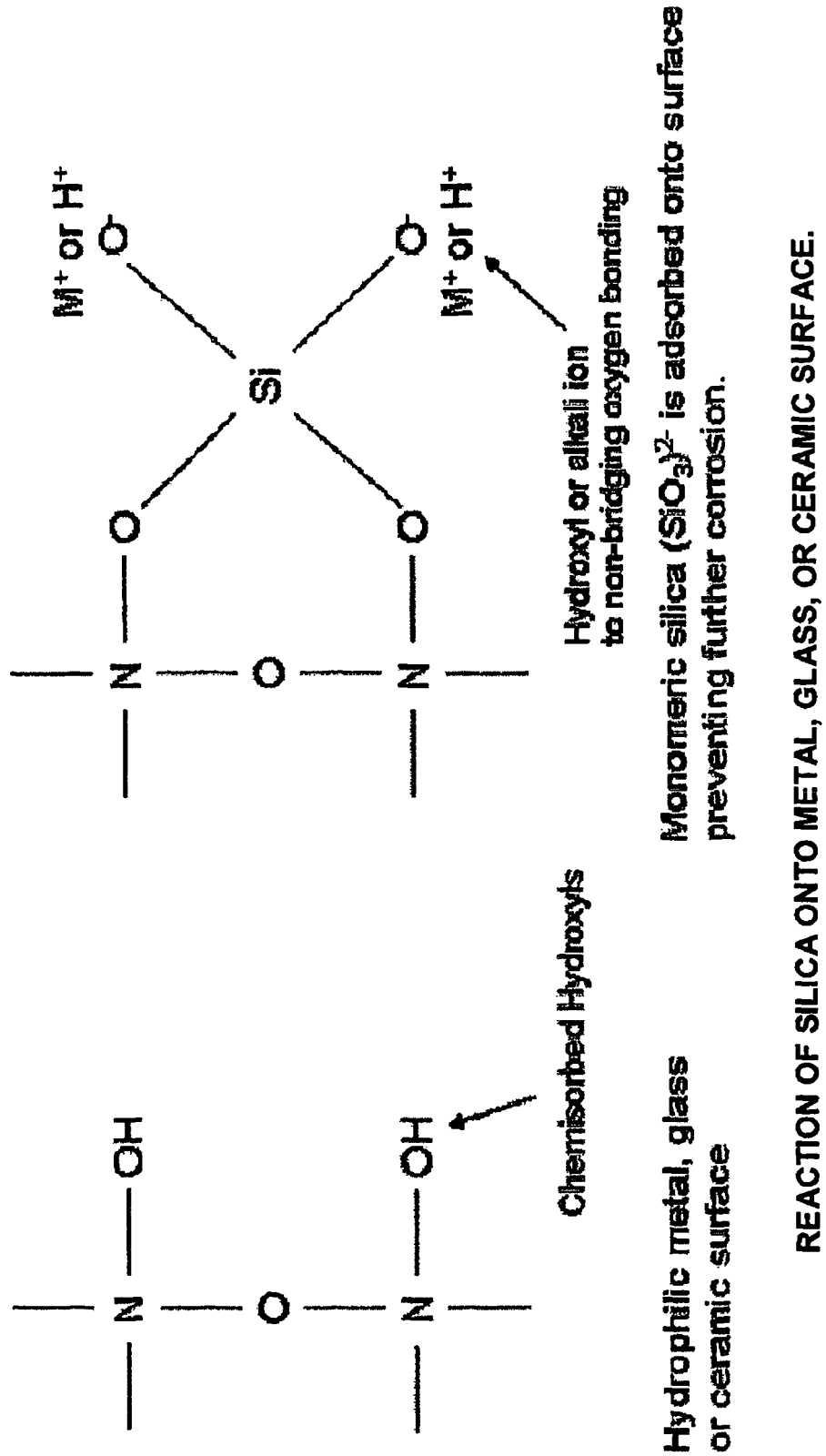
FIG. 1 is an exemplary embodiment of the reaction of silica onto metal, glass, or ceramic surfaces.

Before describing in detail the particular improved system and method, it should be observed that the invention includes, but is not limited to a novel structural combination of conventional data/signal processing components and communications circuits, and not in the particular detailed configurations thereof. Accordingly, the structure, methods, functions, control and arrangement of conventional components and circuits have, for the most part, been illustrated in the drawings by readily understandable block representations and schematic diagrams, in order not to obscure the disclosure with structural details which will be readily apparent to those skilled in the art, having the benefit of the description herein. Further, the invention is not limited to the particular embodiments depicted in the exemplary diagrams, but should be construed in accordance with the language in the claims.

In accordance with an exemplary embodiment, low processing temperature hermetic glass coatings for microelectronics packaging are desirable for hermetically sealing the packaging as well as providing resistance to corrosion and high temperature. These glass coatings are applied and cured at low temperatures, typically $\leq 100°$ C. and produce tightly adhering hermetic (water impermeable) coatings capable of withstanding very high temperatures, theoretically up to ~700° C. These glass coatings may be composed of alkali silicate glass with nanoparticle modifiers, including, but not limited to, nano calcium carbonate, nano zinc oxide and nano silicon dioxide. Aqueous alkali silicate composite solutions applied on or between surfaces of materials, dry to form a tough, tightly adhering inorganic bond that exhibits many desirable characteristics. Additionally, these solutions can be mixed with high thermal conductivity particles, such as, but not limited to, diamond, aluminum nitride, beryllium oxide, or metals to produce high thermal conductivity coatings for heat spreading.

Alkali silicate glasses are produced by fusing varying portions of sand ($SiO_2$) and alkali carbonate, ($M_2CO_3$) at high temperatures, between 1000-1500° C. The resulting product, upon cooling from its molten state, is an amorphous glass that can, under the appropriate processing conditions (temperature and pressure), be dissolved into water to produce liquid alkali silicate solutions. In accordance with an exemplary embodiment the glass is mixed with deionized water. The proportion of $SiO_2$ to $M_2O$ is typically defined as the weight ratio. The solution viscosity can be controlled by the concentration of water.

Alkali silicates, in general, are economical, environmentally friendly chemicals which have been used to protect a variety of materials from the corrosive effects of water. These chemicals are classified as corrosion inhibitors because they can deposit protective silicate rich films, isolating materials from corrosive attack. Additionally, they raise the pH of water which can make it less corrosive to metals. Studies have shown that alkali silicates are reactive with cationic metals and metal surfaces. This is the basis by which silicates inhibit corrosion, as illustrated in FIG. 1. Although alkali silicates have been used to protect materials from corrosion, alkali silicates have not been applied to protecting microelectronics, because in standard, off the shelf configuration, they may not cure appropriately and may not exhibit resultant properties which are desirable for protecting microelectronics in harsh environments.

Liquid alkali silicate solutions are commercially available in a variety of $SiO_2/M_2O$ ratios. Typically, ratios of 3.25 down to 1 can be obtained in aqueous or powder form. Highly siliceous liquid alkali silicate solutions tend to air dry rapidly, are the most refractory (high melting temperature), and are the most resistant to acids and corrosion. These silica rich liquid solutions tend to contain more water than the alkaline rich solutions (per similar viscosity), and thus undergo greater shrinkage while curing. Low ratio, alkaline rich, solutions tend to have greater elasticity, lower brittleness, and less shrinkage but may exhibit poor corrosion resistance. These low ratio coatings also dry more slowly because their alkali content creates a greater affinity for water. Many chemically resistant cements and mortars are produced using high ratio (N~3.25) alkali silicate solutions. In order for the silicate coatings to become impermeable and relatively insoluble, water must be completely removed. Air drying alone is usually not adequate for coatings which will be exposed to weather or high moisture environments. For these applications heat curing is often needed. Curing temperatures between 95 and 100° C. are often sufficient for adequate dehydration.

It is desirable to use highly corrosion resistant coatings in microelectronics packaging. While off-the-shelf alkali silicate solutions applied and processed in an appropriate manner could potentially provide a temporary hermetic barrier for microelectronic devices, they may not hold up in harsh testing environments, such as those produced during Highly Accelerated Stress Testing (HAST). In order to produce highly corrosion resistant coatings, modifiers must be added to the base alkali silicate solutions. Studies have shown that adding colloidal silicon dioxide to liquid alkali silicates can produce coatings that are comparable to that of current chromium based passivation, as characterized by salt spray testing. The purpose of these coatings is to protect steel and other metals from environmental corrosion. While a broad range of alkali silicate compositions may be used, highly silica rich coatings ($R \geqq 3.25$) are the most corrosion resistant. These high ratio solutions can be made by adding additional $SiO_2$ to the base alkali silicate. However, these silica rich coatings often crack during the curing process. This cracking may be avoided by applying the appropriate solution mixture, thickness, and using an appropriate curing process, all of which may be application specific. Successful silicate rich coatings ($R \geqq 4$) have been applied to the surfaces of silicon die and other inorganic substrates, which can be cured quickly, are crack free, and possess excellent adhesion strength and durability. These silica enhanced alkali silicate solutions provide improved corrosion resistance, but they can be made more corrosion resistant with the addition of calcium carbonate and or zinc oxide. Silicate solutions can react with calcium to form insoluble calcium-silicate compounds. Similarly, zinc oxide has been used to produce silicate coatings that are actually capable of shedding water. In order to achieve good mixing and dispersion, nano-sized particles of these constituents may be used in the coatings described herein. The large surface area per weight of the nanoparticles helps to maximize silicate glass modification for improved corrosion resistance of the composite.

It has been shown that increasing the silicate ratio, for alkali silicate glass coatings, may lead to cracking in thick coatings.

In an exemplary lab test, a particular amount of cracking was observed in thick silica rich (R=3.22) coatings, whereas no or little cracking was seen in the alkali rich coatings. In the silica rich coating, delamination was observed around the periphery and significant cracking throughout. When this same solution is applied in the appropriate thickness, a much stronger, crack free, fast curable coating can be formed. Such coatings have been applied to copper clad PCB substrates, aluminum and copper metals, and silicon die. These coatings are thin (<2 microns), but can be applied in multiple layers to build up the thickness. It has been observed that even these very thin coatings can provide a rugged moisture barrier at high temperatures ($\geqq 450°$ C.). The corrosion protection of silicate coating applied to a copper clad PCB board has been demonstrated.

When compared with conventional silicon Room Temperature Vulcanizing (RTV) (polymer) coatings, very little oxidation protection is seen while the alkali silicate glass coating provided a hermetic seal.

In another exemplary embodiment, silica rich coatings may be applied to wire bonded dies. The purpose of the coatings is to prevent galvanic corrosion at the wire bond/pad interface, a primary failure mechanism in these devices. Preventing this galvanic corrosion leads to significantly greater reliability and can potentially eliminate the need for hermetic packaging.

In an exemplary and non-limiting embodiment, the alkali silicate glass coated wire bond pads may be formed by applying alkali silicate solutions onto chip surfaces then quickly curing at 150° C. for 5 minutes. Multiple layers may be applied to each of the coated wire bonds. The result of the coating process has been exemplary shown that the shear strength of coated joints were up to a 25% stronger than uncoated joints. Additionally, pull testing has shown no ball lifts (i.e. there were no separations between ball and pad) in the testing environment.

In addition to thin coatings, composites may be made by mixing the silicate solutions with high thermal conductivity particles such as aluminum nitride, beryllium oxide, diamond, and or metals. These coatings have been found to significantly improve heat transfer when coated over power dissipating devices. For example, thermal improvements in these coated devices are shown in FIG. 2.

Figure 2:
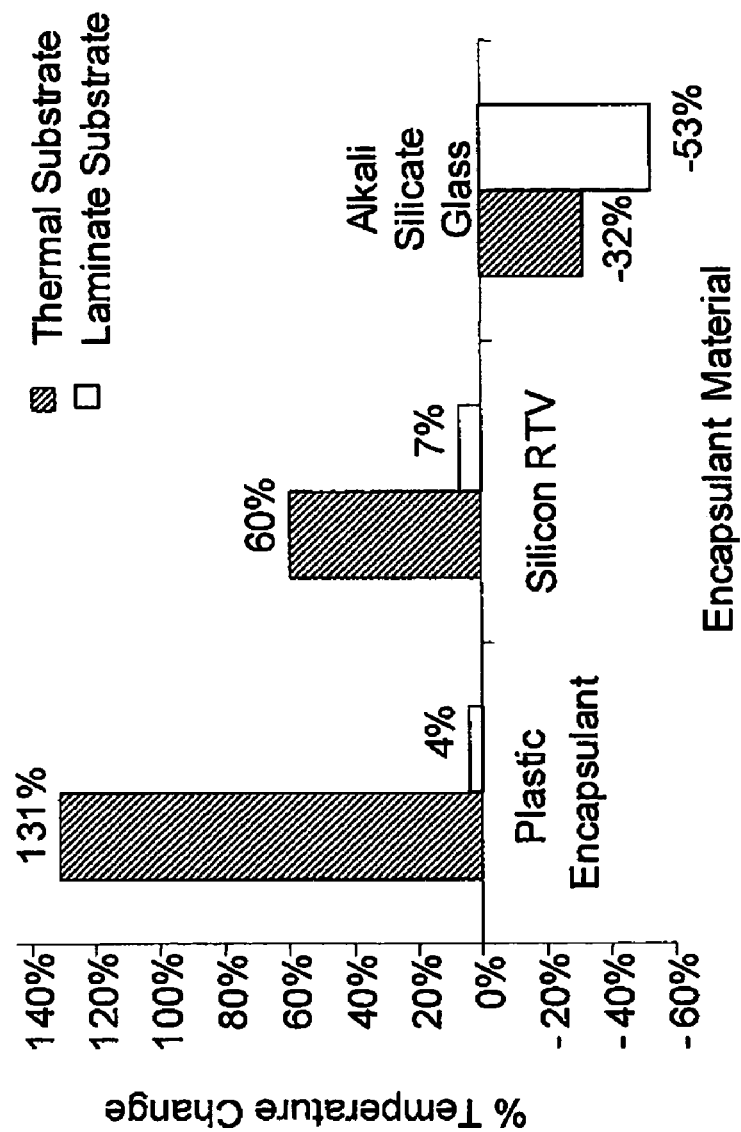
FIG. 2 is an exemplary graph of resultant performance of the thermal properties of alkali silicate glass composites.

Referring to FIG. 2, alkali silicate glass composites have been applied over power dissipating devices mounted on both laminate and copper metal substrates. The resulting package temperatures were reduced by more than 50%, while standard encapsulants caused device temperatures to increase up to 130%.

In a further exemplary embodiment, the addition of nanoparticles to the alkali silicate glass thermal composites provides additional corrosion resistance.

In an alternative exemplary embodiment, a low temperature bonding (LTB) solution, a proprietary composition, available from SCHOTT North America, Inc. may also be used.

Figure 3:
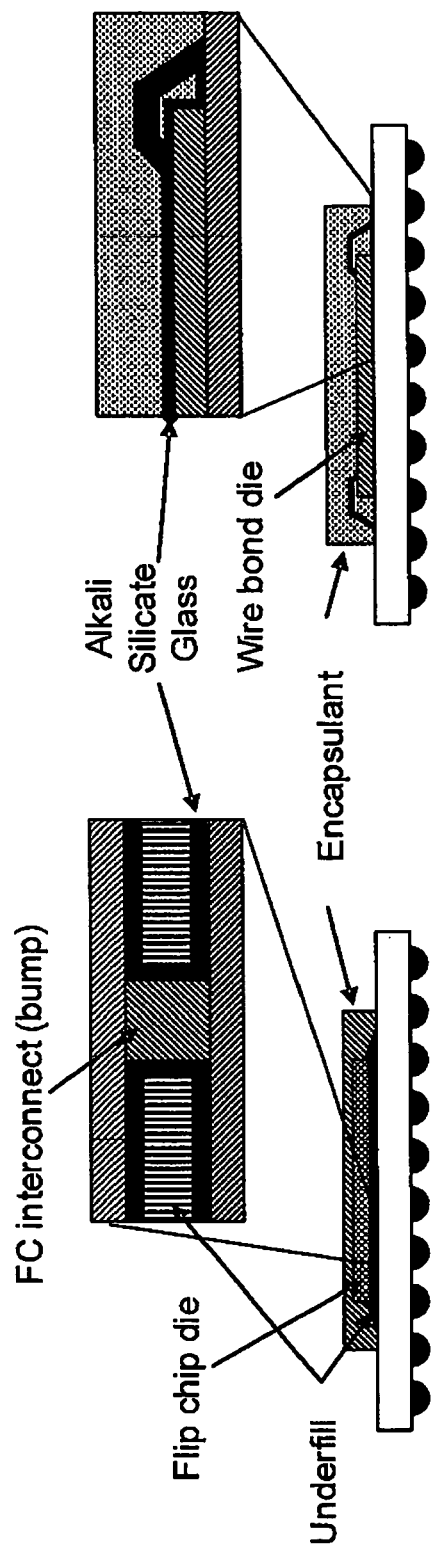
FIGS. 3-8 depict exemplary embodiments of various coating configurations for microelectronic packages.

In accordance with exemplary embodiments, numerous ways may be applied in which to provide heat and corrosion resistance to microelectronics packages. These are detailed below and include but are not limited to the following:

Coating bare dies that have been wire bonded or flip chip attached with a coating to form a hermetic glass barrier over the electronics. The coated device could then presumably be encapsulated using standard processing methods. The coating would be a thin layer of glass ($\geq$100 nm) that will provide a hermetic seal to the die and therefore protect it from corrosive elements. For example, FIG. 3 depicts a coating applied to a flip chip and to a wire bonded dies for corrosion and tamper resistance.

Figure 4:
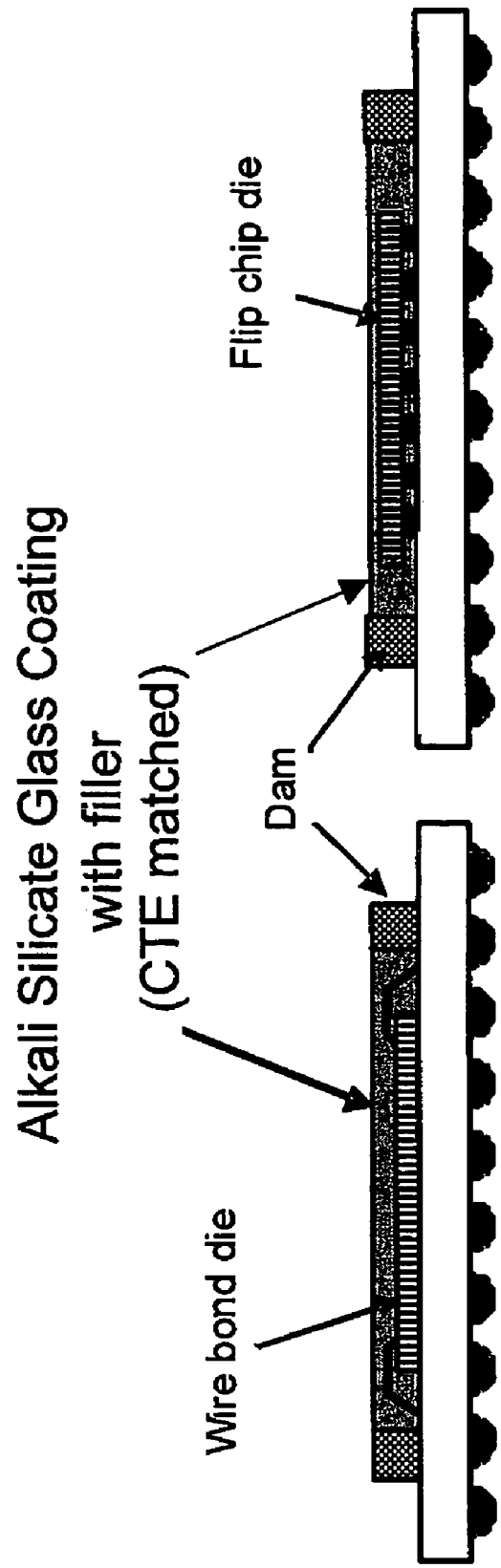

Adding particles to the coating to make it opaque and then coating the solution onto a wire bonded or flip chip die. Thus, the coating would provide tamper resistance to the device without exposing it to high processing temperatures. An illustration of this is shown in FIG. 4 which depicts the coating with opaque filler for the tamper resistance of wire bonded and flip chip dies. Alternatively, the solution could also be applied under a flip chip.

Adding high thermal conductivity particles, such as diamond, beryllium oxide, and or aluminum nitride to the coating prior to applying it to a wire bonded or flip chip die. The resulting coating (or paste) over the die may possess a very high thermal conductivity without creating an electrically conductive path. Thus, hot spots on the die could be easily spread over the entire die surface and conceivably to the boar to which the component is attached.

Figure 5:
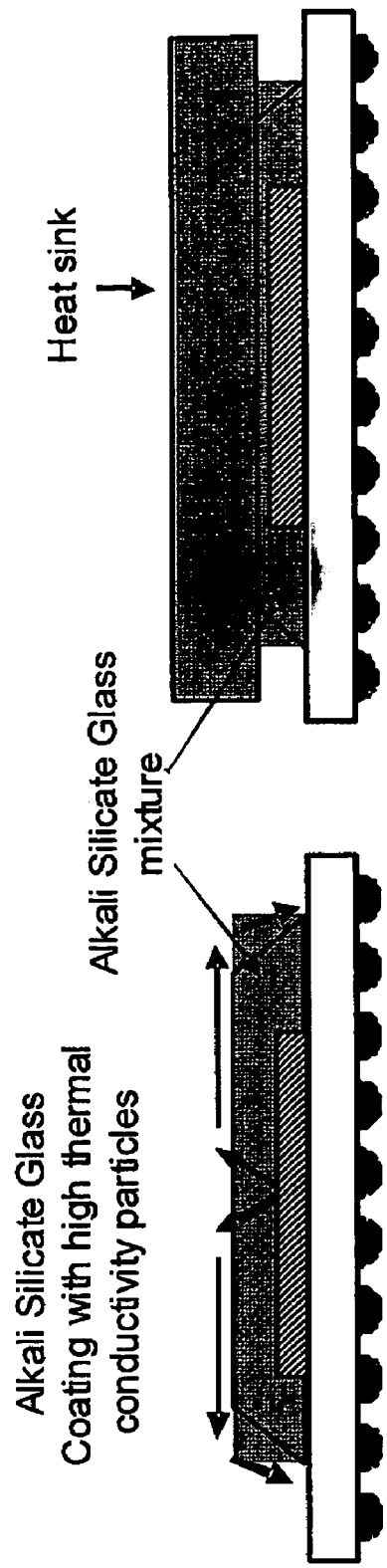

Using high thermal conductivity "filled" coating solution for creating low cost thermal bridges between high temperature components or power dissipating die and thermal sinks. The solution may be applied and cured at low temperature ($\leq$100° C.). High thermal conductivity particles such as aluminum nitride, beryllium oxide, and or diamond (thermal conductivity near 2000 W/mK) can be used in this application to provide a highly thermally conducting path. See FIG. 5 or an exemplary illustration.

Figure 6:
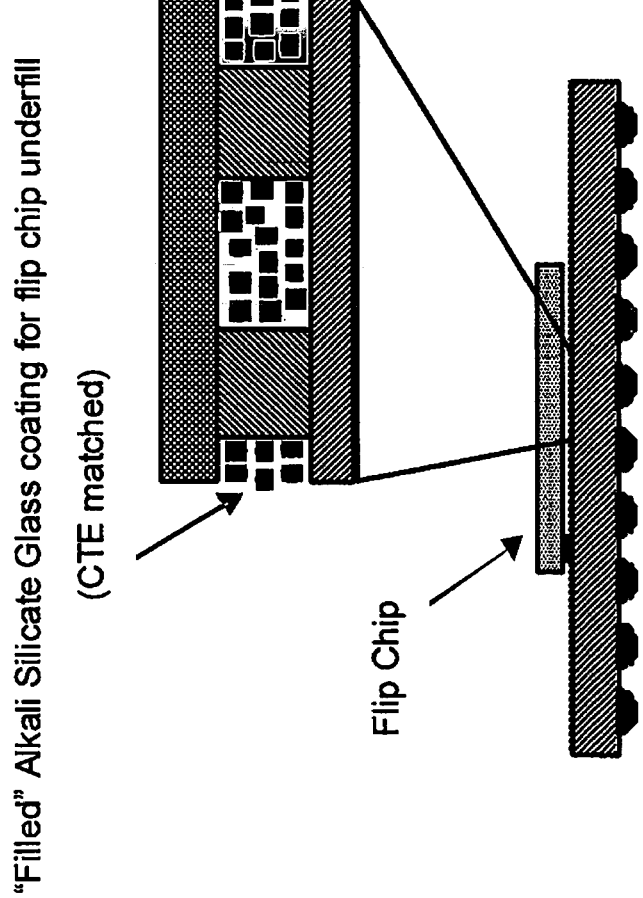

Adding a coefficient of thermal expansion (CTE) matching filler, such as glass or ceramics, to the coating liquid to increase the bond layer thickness so that the solution can be used as an underfill for flip chip devices. This may provide both tamper resistance protection to the die while improving its thermal cycle and shock loading reliability as do many other underfills. Another advantage to this configuration is that these coatings may provide a high-temperature underfill solution (>700° C.). Current underfills are limited to relatively low operating temperatures ($\leq$200° C.). An illustration of this is shown in FIG. 6.

Figure 7:
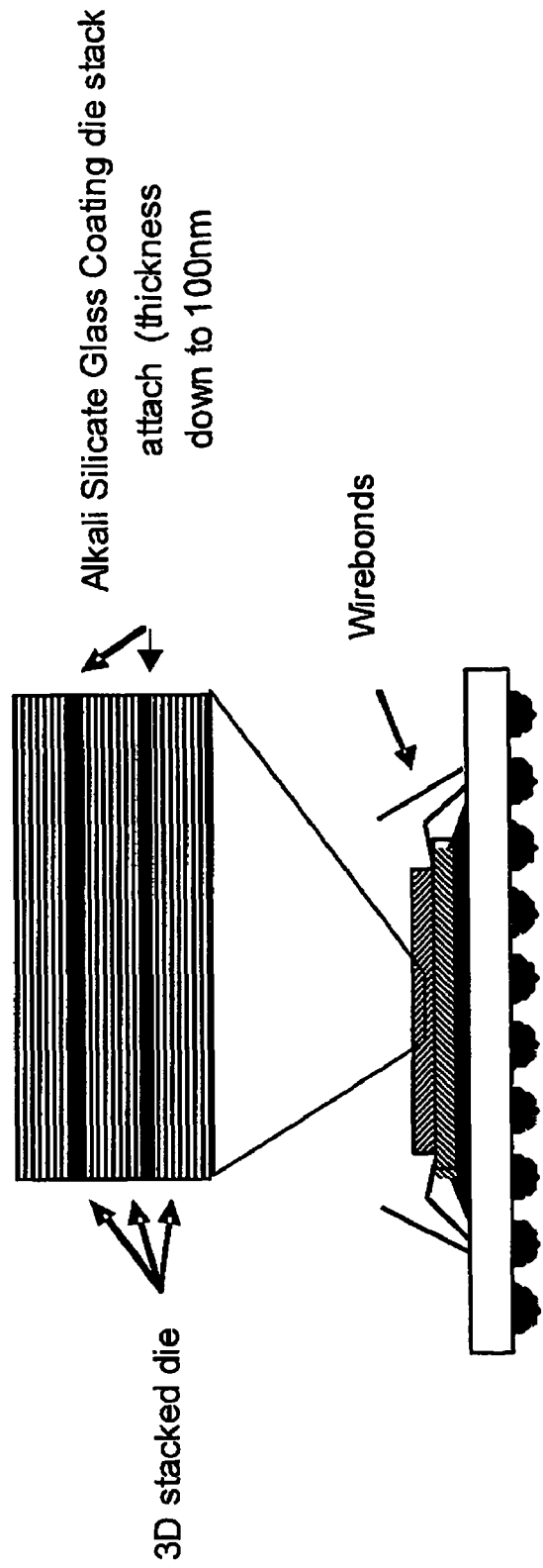

Use these coatings to create 3D wire bondable or flip chip stacked IC's. These coatings provide a unique high-temperature (>200° C.) solution for chip stacking. The coating bond layer thickness can be made as thin as 100 nm, allowing for the thinnest possible interface formed at low temperature. The coating bonds are very strong and rigid allowing the possibility of wire bonding at higher stack levels without stack compliance (smashing) causing problems. The thinner bonding layers would decrease thermal resistance, thus improving heat transfer. High thermal conductivity particles may also be added to improve heat transfer. The majority of chip or wafer stacking adhesives are not hermetic, which can lead to corrosion and degradation of the bonding interface over time. See FIG. 7, for example.

Figure 8:
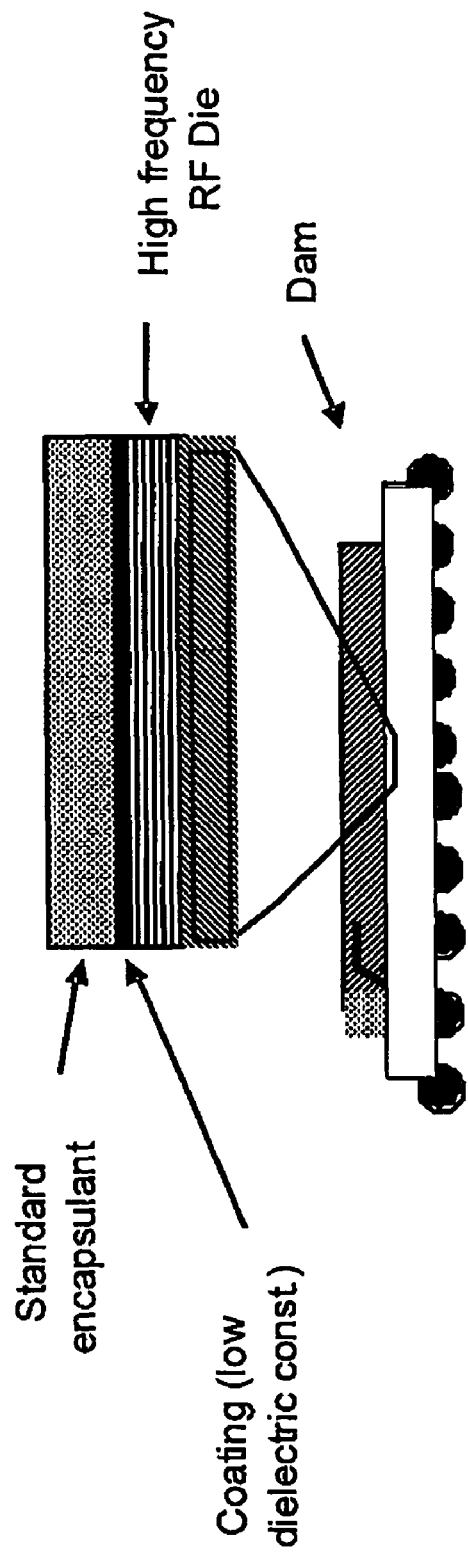

Applying coating over high frequency electronic components to create a low dielectric coating (Er=3 to 10) to improve RF performance. These devices may then be encapsulated using standard methods and encapsulants to improve their reliability and handling characteristics without degrading their electrical performance. See FIG. 8 for an example.

While the detailed drawings, specific examples, and particular formulations given described exemplary embodiments, they serve the purpose of illustration only. It should be understood that various alternatives to the embodiments of the invention described maybe employed in practicing the invention. It is intended that the following claims define the scope of the invention and that structures within the scope of these claims and their equivalents be covered thereby. The hardware and software configurations shown and described may differ depending on the chosen performance characteristics and physical characteristics of the computing and analysis devices. For example, the type of computing device, communications bus, or processor used may differ. The systems shown and described are not limited to the precise details and conditions disclosed. Method steps provided may not be limited to the order in which they are listed but may be ordered any way as to carry out the inventive process without departing from the scope of the invention. Furthermore, other substitutions, modifications, changes and omissions may be made in the design, operating conditions and arrangements of the exemplary embodiments without departing from the scope of the invention as expressed in the appended claims.

What is claimed is:

1. A method of forming an electronics package, comprising:
   providing a substrate;
   providing at least one integrated circuit die on the substrate;
   mixing an alkali silicate glass with a solvent, the alkali silicate glass produced from $SiO_2$ and $M_2O$, wherein M is an alkali metal;
   depositing the alkali silicate glass onto the integrated circuit die and the substrate after providing the at least one integrated circuit die on the substrate; and
   curing the alkali silicate glass to form a coating covering at least a portion of the integrated circuit die and at least a portion of the substrate.

2. A method of claim 1, wherein the solvent comprises deionized water.

3. A method of claim 1, wherein the curing is carried out at room temperature.

4. A method of claim 1, wherein the curing is carried out at an elevated temperature.

5. A method of claim 4, wherein the elevated temperature is approximately 100 to 150 degrees C.

6. A method of claim 1, further comprising:
   adding particles to the mixture of alkali silicate glass and the solvent.

7. A method of forming an electronics package, comprising:
   providing a substrate;
   providing at least one integrated circuit die on the substrate;
   mixing an alkali silicate glass material with water, the alkali silicate glass material produced from $SiO_2$ and $M_2O$, wherein M is an alkali metal;
   depositing the glass material as a coating onto the integrated circuit die and the substrate after providing the at least one integrated circuit die on the substrate; and
   curing the glass material, wherein the coating covers at least a portion of the integrated circuit die and at least a portion of the substrate.

8. The method of claim 7, wherein the water comprises deionized water.

9. The method of claim 7, wherein the curing is carried out at room temperature.

10. The method of claim 7, wherein the curing is carried out at an elevated temperature.

11. The method of claim 10, wherein the elevated temperature is approximately 100 to 150 degrees C.

12. The method of claim 7, further comprising:
    adding particles to the mixture of glass material and water.

13. A method of making an electronics package including a printed circuit board, at least one integrated circuit coupled to the printed circuit board, and an alkali silicate glass coating forming a hermetic seal around at least a portion of the at least one integrated circuit, the method comprising:
  providing the printed circuit board;
  providing the at least one integrated circuit on the printed circuit board;
  mixing an alkali silicate material with a solvent, the alkali silicate material produced from SiO2 and M2O, wherein M is an alkali metal;
  depositing the alkali silicate material onto the integrated circuit and printed circuit board after providing the at least one integrated circuit on the printed circuit board; and
  curing the alkali silicate material to form the alkali silicate glass coating covering at least a portion of the integrated circuit and at least a portion of the printed circuit board.

14. The method of claim 13, wherein the alkali silicate glass coating is formed by mixing the alkali silicate glass in a solvent.

15. The method of claim 13, wherein the solvent comprises water.

16. The method of claim 15, wherein the ratio of the water to sodium silicate glass is at least 3 to 1.

17. The method of claim 15, wherein the ratio of the water to sodium silicate glass is at least 5 to 1.

18. The method of claim 15, wherein the water comprises deionized water.

19. The method of claim 15, wherein the coating comprises thermally conductive particles.

20. The method of claim 13, wherein the electronics package comprises a wire bond and the alkali silicate material is applied to the wire bond.

21. A method of forming an electronics package, including a substrate, at least one power dissipating die coupled to the substrate, and an alkali silicate glass coating forming a hermetic seal around at least a portion of the at least one power dissipating die, the method comprising: providing the substrate; providing the at least one power dissipating die on or over the substrate; mixing an alkali silicate material with a solvent, the alkali silicate material produced from $SiO_2$ and $M_2O$, wherein M is an alkali metal; depositing the alkali silicate material onto the power dissipating die after providing the at least one power dissipating die on or over the substrate; and curing the alkali silicate material to form a coating covering at least a portion of the power dissipating die and the substrate.

22. The method of claim 21, wherein the glass coating is formed by diluting the alkali silicate glass in a solvent.

23. The method of claim 22, wherein the solvent comprises water.

24. The method of claim 22, wherein the ratio of water to LTB is at least 3 to 1.

25. The method of claim 22, wherein the ratio of water to LTB is at least 5 to 1.

26. The method of claim 25, wherein the water comprises deionized water.

27. The method of claim 22, wherein the coating comprises thermally conductive particles.

28. The method of claim 1, wherein the integrated circuit die comprises at least one of a wire bonded die or a flip chip die.

29. The method of claim 28, wherein the alkali silicate material is provided between the at least one of a wire bonded die or a flip chip die and a substrate.

30. The method of claim 28, wherein the alkali silicate material is provided at a wire bond/pad interface.

31. The method of claim 28, wherein the integrated circuit die is part of a three dimensional stacked integrated circuit.

32. The method of claim 1, wherein the integrated circuit die comprises a communications circuit.

33. The method of claim 1, wherein the integrated circuit die comprises a high frequency electronic component.

34. The method of claim 1, wherein the coating forms a hermetic seal around the integrated circuit die.

* * * * *